United States Patent [19]

Ham

[11] Patent Number: 5,573,634
[45] Date of Patent: Nov. 12, 1996

[54] METHOD FOR FORMING CONTACT HOLES OF A SEMICONDUCTOR DEVICE

[75] Inventor: Young M. Ham, Kyoungki-do, Rep. of Korea

[73] Assignee: Hyundai Electronics Industries Co. Ltd., Kyoungki-do, Rep. of Korea

[21] Appl. No.: 362,145

[22] Filed: Dec. 22, 1994

[30] Foreign Application Priority Data

Dec. 23, 1993 [KR] Rep. of Korea .................. 93 29273

[51] Int. Cl.$^6$ ..................................... H01L 21/47
[52] U.S. Cl. ................. 156/659.11; 430/312; 430/394; 430/952
[58] Field of Search ................. 156/644, 651, 156/659.11; 430/22, 312, 394, 952

[56] References Cited

U.S. PATENT DOCUMENTS

| | | | |
|---|---|---|---|
| 3,594,168 | 2/1968 | Compare | 430/312 |
| 3,598,604 | 11/1994 | De Puy | 430/312 |
| 3,823,015 | 1/1973 | Fassett | 430/312 |
| 4,610,940 | 10/1984 | Araihava | 430/5 |
| 5,100,508 | 10/1990 | Yoshida | 156/659.1 |
| 5,132,195 | 7/1992 | Pool | 430/22 |
| 5,284,725 | 2/1994 | Takatsu | 430/5 |
| 5,306,585 | 4/1993 | Okamoto | 430/5 |
| 5,308,741 | 5/1994 | Kemp | 430/312 |
| 5,424,154 | 6/1995 | Borodorsky | 430/5 |
| 5,429,897 | 7/1995 | Yoshioka | 430/5 |

*Primary Examiner*—George Fourson
*Assistant Examiner*—Scott Kirkpatrick
*Attorney, Agent, or Firm*—Nath & Associates; Gary M. Nath; Richard E. Campbell

[57] ABSTRACT

A method for forming contact holes, capable of achieving an increased tolerance in design rule for formation of contact holes by: forming an insulating film over a semiconductor substrate; coating a positive photoresist film over the insulating film; primarily exposing the photoresist film to a light using a first exposure mask having windows adapted to allow portions of the insulating film corresponding to a part of contact holes to be exposed to the light, the part of contact holes having contact holes arranged diagonally to each other; secondarily exposing the photoresist film to the light using a second exposure mask having windows arranged diagonally to each other and not overlapped with those of the first exposure mask; removing the light-exposed portions of the photoresist film to form a photoresist film pattern for exposing portions of the insulating film respectively corresponding to the contact holes; and forming the contact holes using the photoresist film pattern as a mask. Since an approximation effect of contact holes is reduced by virtue of the increase tolerance in design rule for formation of contact holes, it is possible to obtain a more reduced space between adjacent contacts and thereby to form contact holes having a more increased dimension. Accordingly, the process yield can be increased.

1 Claim, 3 Drawing Sheets

METHOD FOR FORMING CONTACT HOLES OF A SEMICONDUCTOR DEVICE

BACKGROUND OF THE INVENTION

1. Field of the Invention

The present invention relates to a method for forming contact holes of a semiconductor device, and more particularly to a method for forming contact holes of a semiconductor device, capable of achieving the formation of contact holes having a critical dimension and yet exhibiting an increased tolerance in design rule.

2. Description of the Prior Art

The recent tendency in fabricating highly integrated semiconductor devices is greatly affected by the development of techniques for forming patterns having a critical dimension. Photoresist film patterns formed by a photolithography process are widely used as masks for carrying out an etching process or an ion implantation process in the fabrication of semiconductor devices. In this regard, it is required to achieve a patterning of photoresist film patterns having a critical dimension, a stable performance of process steps, a clean removal of the photoresist film patterns after completion of the process steps, and an easy re-working for forming a new photoresist film pattern after the removal of an inaccurately formed photoresist film pattern.

Generally, a photoresist film pattern is formed by uniformly coating a photoresist solution consisting of a photoresist agent and a resin solved in a solvent in certain amounts over a semiconductor substrate by use of a spin coating process to form a photoresist film, and then selectively irradiating a light onto the photoresist film through a light exposure mask provided with light shield film patterns made of chromium by use of a step and repeat exposure device (hereinafter referred to as "stepper") adapted to repeatedly carry out an alignment and a light exposure, thereby exposing to the light a portion of the photoresist film except for its portion to form the photoresist film pattern. In this case, the light shield film patterns of the light exposure mask have a dimension larger than that corresponding to the resolution of the stepper.

Thereafter, the light-exposed portion of the photoresist film is removed using a weak alkali development solution containing tetra methyl ammonium hydroxide as its base component.

However, this general technique has difficulty in forming a fine pattern having a critical dimension not larger than a predetermined dimension, for example, a pattern having a pattern space not more than 0.4 μm due to various limitations on the accuracy of the light exposure device and wavelength of light.

In other words, the resolution R of the stepper used to fabricate conventional semiconductor devices is in reverse proportion to the numerical aperture of the light exposure device and in proportion to the wavelength of a light source. As a result, the resolution is limited because there are limitations on reducing the wavelength of light and increasing the numerical aperture.

For example, G-line, i-line and excimez laser steppers having wavelengths of 436, 365 and 248 nm have resolutions only capable of forming patterns of about 0.7, 0.5 and 0.3 μm, respectively.

As a semiconductor device has a higher integration degree, its cell size is reduced. This also results in a limited design rule for each thin film. In the case of forming contact holes, the design rule is limited due to the reduced unit cell size and the degraded process capability. Such a limited design rule results in reductions in various design margins such as the contact size, the space between adjacent contacts and the overlap of each contact with a lower layer disposed beneath the contact.

Where contact holes are defined using a positive photoresist film for forming the contact holes having a critical dimension of a semiconductor device, an exposure mask 10 shown in FIG. 1 is used.

As shown in FIG. 1, the exposure mask 10 has a light shield film 12 formed over a quartz substrate (not shown). The exposure mask 10 also has windows 14 each formed by removing a portion of the light shield film 12 corresponding to each contact hole to be formed.

Since each contact hole has a reduced dimension due to a high integration of a semiconductor device, the exposure mask 10 has a reduced dimension a of each window 14. In this case, the space b between adjacent windows 14 corresponding to the space between adjacent contact holes is also reduced.

As the dimension a approximates to an optical limitation by the light exposure device, light beams passing through the exposure mask 10 interfere with one another if the value of b/a is less than 1. In this case, an interference light is generated between adjacent regions where contact holes are defined, as shown in FIG. 2. Due to this interference light, a photoresist film pattern for forming the contact holes is damaged or inaccurately formed. In a severe case, no contact hole is formed. Consequently, the process yield is degraded.

SUMMARY OF THE INVENTION

Therefore, an object of the present invention is to eliminate the above-mentioned problems encountered in the prior art and, thus to provide a method for forming contact holes, capable of achieving an increased design rule and thereby forming contact holes having a critical dimension by coating a positive photoresist film over a semiconductor structure to be formed with a plurality of contact holes, successively exposing the photoresist film to a light using two exposure masks each having windows arranged diagonally to each other and arranged orthogonally to those of the other mask, thereby forming a photoresist film pattern for exposing portions of an insulating film on the semiconductor structure respectively corresponding to the contact holes.

In accordance with the present invention, this object can be accomplished by providing a method for forming a plurality of contact holes in a semiconductor device, comprising the steps of:

forming an insulating film over a semiconductor substrate;

coating a photoresist film over the insulating film;

primarily exposing the photoresist film to a light using a first exposure mask having windows arranged such that portions of the insulating film respectively corresponding to those of the contact holes arranged diagonally to each other are exposed to the light;

secondarily exposing the photoresist film to the light using a second exposure mask having windows arranged such that portions of the contact holes respectively corresponding to the remaining ones of the contact holes are arranged diagonally to each other;

forming a photoresist film pattern for exposing the light-exposed portions of the insulating film respectively corresponding to the contact holes; and removing the light-exposed portions of the insulating film, thereby forming the contact holes.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENT

Figure 3A:
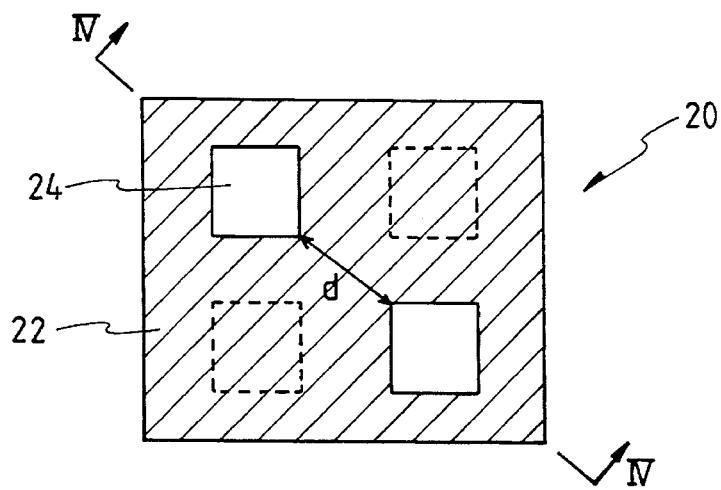
FIGS. 3A and 3B are plan views respectively illustrating exposure masks used to form contact holes in accordance with a method of the present invention.
Figure 5A:
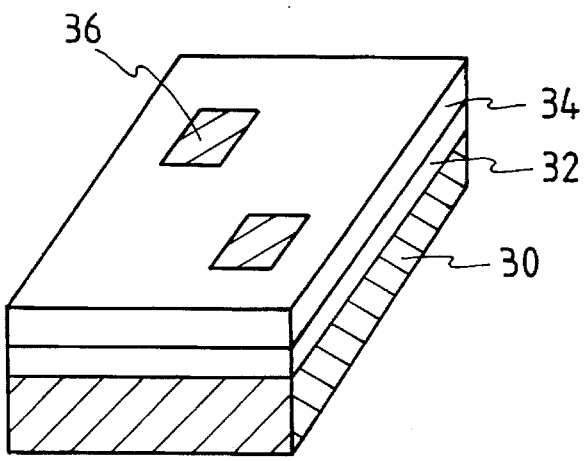
FIGS. 5A to 5C are sectional views respectively illustrating a method for forming contact holes in accordance with the present invention.
Figure 5B:
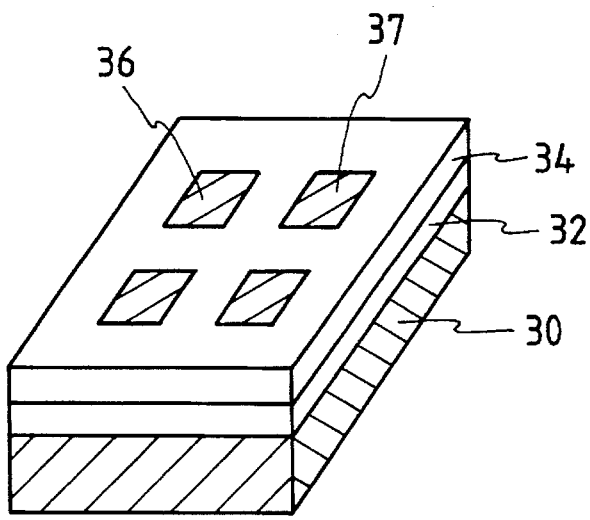
Figure 5C:
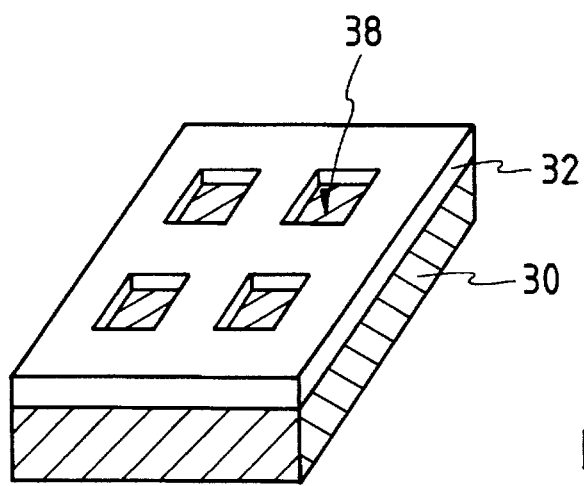

FIGS. 5A to 5C are sectional views respectively illustrating a method for forming contact holes in accordance with the present invention. In accordance with the present invention, the formation of contact holes is carried out using exposure masks respectively shown in FIGS. 3A and 3B.

Figure 1:
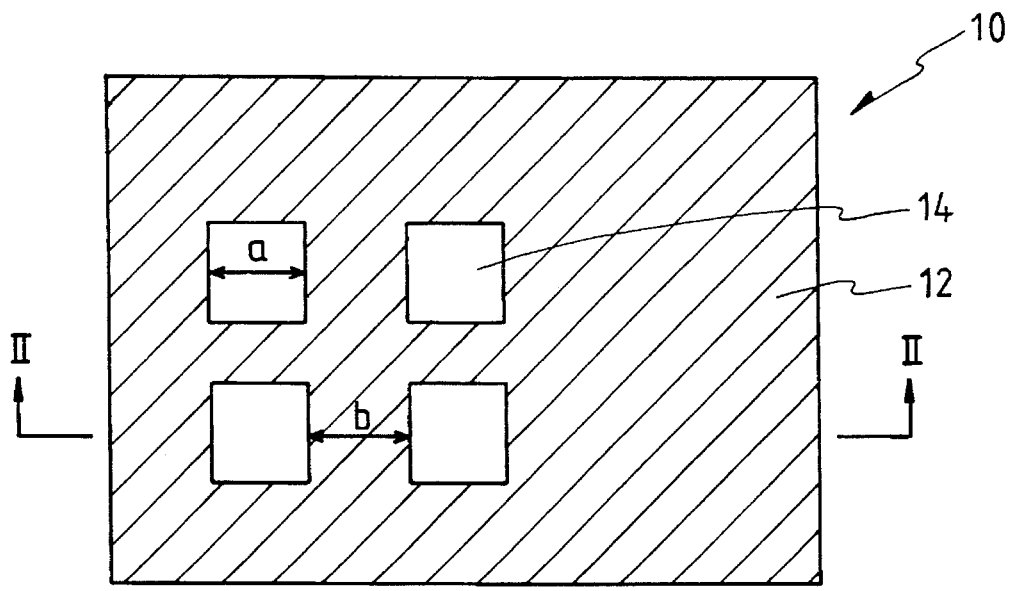
FIG. 1 is a plan view of an exposure mask used to form contact holes in accordance with a conventional method.
Figure 2:
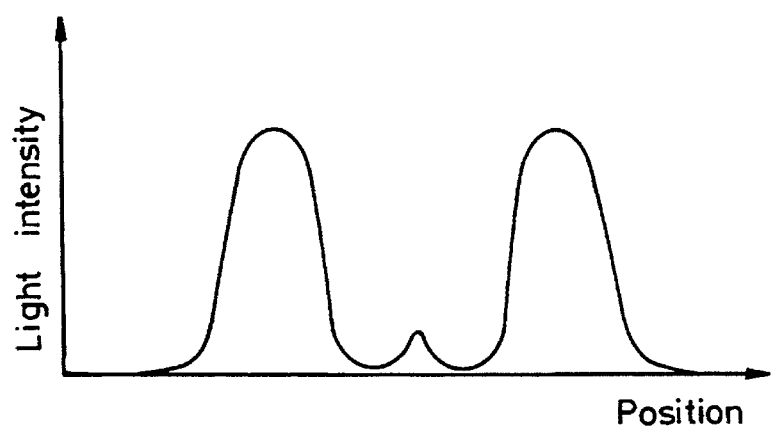
FIG. 2 is a graph illustrating a variation in intensity of light passing through the exposure mask of FIG. 1 depending on the position of the exposure mask.

In accordance with the method of the present invention, first, an insulating film 32 comprised of an oxide film, a nitride film or a spin-on-glass film is formed over a semiconductor substrate 30, as shown in FIG. 5A. Over the insulating film 32, a positive photoresist film 34 is coated. Thereafter, the photoresist film 34 is subjected to a primary light exposure using a first exposure mask 20 shown in FIG. 3A, thereby forming two photoresist regions 36 arranged diagonally to each other. In order to form only two contact holes arranged diagonally to each other, the first exposure mask 20 has two windows 24 formed by corresponding portions of a light shield film 22 therefor. Accordingly, the first exposure mask 20 has an increased space d between adjacent windows 24, as compared to the spaces a and b in the case of FIG. 1 (FIG. 5A).

Figure 3B:
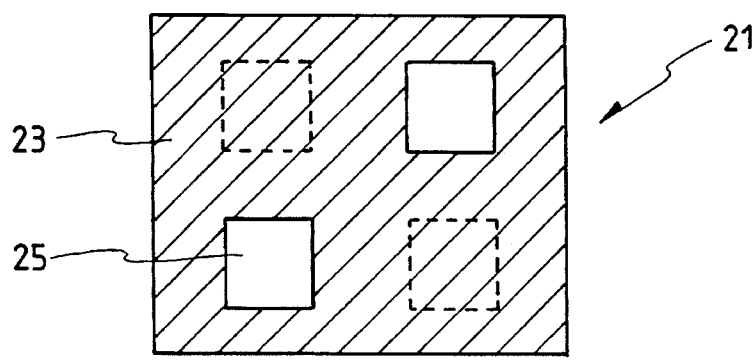
Figure 4:
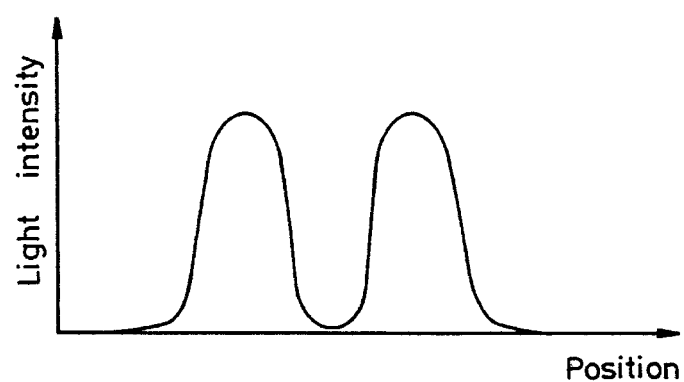
FIG. 4 is a graph illustrating a variation in intensity of light passing through each of the exposure masks of FIGS. 3A and 3B depending on the position of each exposure mask.

Subsequently, the photoresist film 34 is subjected to a secondary light exposure using a second exposure mask 21 shown in FIG. 3B, thereby forming two photoresist regions 37 arranged diagonally to each other and arranged orthogonally to the photoresist regions 36 already formed. The second exposure mask 21 has two windows 25 formed by corresponding portions of a light shield film 23 thereof and arranged such that they are not overlapped with the windows 22 of the first exposure mask 20. Similar to the first exposure mask 20, the second exposure mask 21 has an increased space d between adjacent windows 25. Since the first and second exposure masks 20 and 21 have windows 24 and 25 having a sufficiently large space d, no interference occurs among light beams passing through the windows 24 and 25. As a result, an accurate light exposure is achieved, as shown in FIG. 5B.

Thereafter, portions of the photoresist film 34 respectively corresponding to the light-exposed photoresist regions 36 and 37 are removed, thereby forming a pattern of the photoresist film 34 for exposing portions of the insulating film 32 respectively corresponding to contact holes to be formed, as shown in FIG. 5C. As a result, contact holes 38 are formed. After the formation of contact holes 38, the photoresist film pattern is removed. Since the contact holes can be formed without any effect caused by the space between adjacent contact holes, it is possible to realize the design rule defining a contact hole space of not more than 0.3 μm. Accordingly, the method of the present invention can be applied to the fabrication of dynamic random access memories of 256 Mega grade.

Although the illustrated embodiment has been described as using the positive photoresist film to have a pattern corresponding to a non-exposure region, the present invention may be applied to the case using a negative photoresist film to have a pattern corresponding to an exposure region. In this case, the pattern having a critical dimension can be obtained by shifting patterns of the exposure masks.

As apparent from the above description, the present invention provides a method for forming contact holes, capable of achieving an increased tolerance in design rule for formation of contact holes by: forming an insulating film over a semiconductor substrate; coating a positive photoresist film over the insulating film; primarily exposing the photoresist film to a light using a first exposure mask having windows adapted to allow portions of the insulating film corresponding to a part of contact holes to be exposed to the light, the part of contact holes having contact holes arranged diagonally to each other; secondarily exposing the photoresist film to the light using a second exposure mask having windows arranged diagonally to each other and not overlapped with those of the first exposure mask; removing the light-exposed portions of the photoresist film to form a photoresist film pattern for exposing portions of the insulating film respectively corresponding to the contact holes; and forming the contact holes using the photoresist film pattern as a mask. Since the approximation effect of contact holes is reduced by virtue of the increased tolerance in design rule for formation of contact holes, it is possible to obtain a more reduced space between adjacent contacts and thereby to form contact holes having a more increased dimension. Accordingly, the process yield can be increased.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for forming a plurality of contact holes in a semiconductor device, the contact holes being arranged in an array of rows and columns comprising diagonal rows of contact holes, wherein the spacing of the contact holes is such that during a photolithography step used to expose a photoresist film at the positions of the contact holes constructive interference occurs and causes a relative maximum of light intensity which exposes portions of the photoresist layer between the contact holes, comprising the steps of:

forming an insulating film over a semiconductor substrate;

coating the photoresist film over the insulating film;

exposing the photoresist film to light using a first exposure mask having windows arranged such that portions of the photoresist film corresponding to positions of the contact holes arranged in diagonal rows which are not adjacent each other are exposed to the light during the photolithography step;

exposing the photoresist film to the light using a second exposure mask having windows arranged to expose the photoresist film at the remaining positions of the con tact holes using the photolithography step;

removing the exposed portion of the photoresist to expose the contact hole positions; and removing the insulating layer at the contact hole positions, thereby forming the contact holes.

\* \* \* \* \*